US006853663B2

(12) United States Patent
Hasnain et al.

(10) Patent No.: US 6,853,663 B2
(45) Date of Patent: Feb. 8, 2005

(54) EFFICIENCY GAN-BASED LIGHT EMITTING DEVICES

(75) Inventors: Ghulam Hasnain, Palo Alto, CA (US); Richard P. Schneider, Mountain View, CA (US); Scott W. Corzine, Sunnyvale, CA (US); Mark Hueschen, Palo Alto, CA (US); Tetsuya Takeuchi, Mountain View, CA (US); Danny E. Mars, Los Altos, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/026,232

(22) Filed: Dec. 21, 2001

(65) Prior Publication Data

US 2002/0110172 A1 Aug. 15, 2002

Related U.S. Application Data

(63) Continuation-in-part of application No. 09/586,406, filed on Jun. 2, 2000, now Pat. No. 6,526,082.

(51) Int. Cl.$^7$ ................................................. H01S 5/00
(52) U.S. Cl. ............................... 372/46; 372/43; 372/45
(58) Field of Search ............................... 372/43, 46, 27, 372/45

(56) References Cited

U.S. PATENT DOCUMENTS

| | | | | | |
|---|---|---|---|---|---|
| 5,070,510 | A | * | 12/1991 | Konushi et al. | ............... 372/46 |
| 5,079,774 | A | * | 1/1992 | Mendez et al. | ................ 372/27 |
| 5,331,654 | A | * | 7/1994 | Jewell et al. | ................. 372/45 |
| 5,383,211 | A | * | 1/1995 | Van de Walle et al. | ........ 372/43 |
| 5,530,267 | A | * | 6/1996 | Brandle, Jr. et al. | ........... 257/76 |
| 5,693,965 | A | * | 12/1997 | Yamada | ........................ 257/94 |
| 5,779,027 | A | * | 7/1998 | Ensch et al. | ................... 372/46 |
| 5,892,784 | A | * | 4/1999 | Tan et al. | ...................... 372/43 |
| 5,953,362 | A | * | 9/1999 | Pamulapati et al. | ........... 372/96 |
| 6,100,546 | A | * | 8/2000 | Major et al. | ................. 257/103 |
| 6,294,440 | B1 | * | 9/2001 | Tsuda et al. | ................. 428/479 |
| 6,369,403 | B1 | * | 4/2002 | Holonyak, Jr. | ............... 257/13 |
| 6,501,154 | B2 | * | 12/2002 | Morita et al. | ................ 257/628 |
| 6,515,313 | B1 | * | 2/2003 | Ibbetson et al. | ............. 257/103 |

OTHER PUBLICATIONS

Smith et al. ("Determination of Wurtzite . . . "), 1998, Applied Physics Letters, vol. 72, No. 17, pp. 2114–2116.*
Want et al. ("Piezoelectric Effect . . . "), Jun. 1997, IEEE Photonics Technology Letters, vol. 9, No. 6, pp. 728–730.*
Ramachandran et al. ("Inversion of Wurtzite . . . "), Aug. 1999, Applied Physics Letters, vol. 75, No. 6, pp. 808–810.*
Yeo et all, ("Effect of the (1010) . . . "), Jul. 1998, IEEE Journal of Quantum Electronics, vol. 34, No. 7, pp. 1270–1279.*

* cited by examiner

Primary Examiner—David Porta
Assistant Examiner—Davienne Monbleau

(57) ABSTRACT

An optical semiconductor device having an active layer for generating light via the recombination of holes and electrons therein. The active layer is part of a plurality of semiconductor layers including an n-p junction between an n-type layer and a p-type layer. The active layer has a polarization field therein having a field direction that depends on the orientation of the active layer when the active layer is grown. In the present invention, the polarization field in the active layer has an orientation such that the polarization field is directed from the n-layer to the p-layer.

10 Claims, 3 Drawing Sheets

EFFICIENCY GAN-BASED LIGHT EMITTING DEVICES

RELATED APPLICATIONS

This is a continuation-in-part of U.S. patent application Ser. No. 09/586,406 filed Jun. 2, 2000 now U.S. Pat. No. 6,526,082.

FIELD OF THE INVENTION

The present invention relates to semiconductor lasers and light emitting diodes, and more particularly, to an improved device architecture that increases the efficiency of such devices.

BACKGROUND OF THE INVENTION

The development of short wavelength light emitting devices is of great interest in the semiconductor arts. Such short wavelength devices hold the promise of providing increased storage density for optical disks as well as full-color displays and white light sources when used in conjunction with devices that emit light at longer wavelengths. For example, blue lasers are expected to increase the storage density of optical disks by a factor of three.

One promising class of short wavelength light emitting devices is based on group III-V semiconductors, particularly group III nitride semiconductors. As used herein, the class of group III nitride semiconductors includes GaN, AlN, InN, BN, and alloys thereof, such as GaInN, AlGaN, and AlGaInN. To simplify the following discussion, "GaN semiconductors" includes GaN, and group III nitride semiconductors whose primary component is the GaN as in GaInN, AlGaN, AlGaInN.

Light emitting diodes (LEDs) and semiconductor laser diodes are fabricated on epitaxially grown layers of GaN and related alloys of semiconductor materials including an active layer that generates light by recombining holes and electrons. The active layer is sandwiched between p-type and n-type contacts to form a p-n or n-p diode structure. A p-electrode and an n-electrode are used to connect the p-contact and n-contact, respectively, to the power source used to drive the device. The overall efficiency of the device may be defined to be the light emitted to the outside per watt of drive power. To maximize the light efficiency, both the light generated per watt of drive power in the active layer and the amount of light exiting from the device in a useful direction must be considered.

GaN based LEDs and laser diodes (LDs) are fabricated by epitaxy techniques where the LED or LD layer structure is grown "p-up" on top of a relatively thick n-type GaN (or AlGaN) buffer layer which is typically grown on a sapphire or SiC substrate. The individual devices are then defined by a mesa etch through the p-n junction. The anode or p-type contact metal is applied to the top of the mesa and the specific resistance of the Schottky contact is minimized by the use of a large work-function metal such as Ni or Pd and by the use of very high p-type doping in the topmost regions of the p-type layers. For the conductive n-type SiC substrate, the cathode is a large-area ohmic contact formed by metallizing the substrate back surface. In the case of the non-conducting sapphire substrate, the cathode or n-type contact metal is applied in the field close to the mesa edge to provide a lateral current flow through the thick n-type buffer layer to the p-n junction within the mesa.

There are several drawbacks to this conventional design. First, p-type GaN is very resistive compared to other common semiconductors even when grown under optimized conditions. As a result, there is virtually no lateral current spreading in p-type GaN. To overcome this lack of current spreading, conventional p-up LEDs require a semi-transparent metal electrode that covers the p-contact to provide the lateral current spreading. This electrode reduces that amount of light that leaves the device, and hence, reduces the efficiency. In p-type AlGaN, the resistivity is even higher, increasing with increasing Al mole-fraction. Thus the p-type AlGaN layer in laser diodes used for optical wave-guiding causes further resistive heating that degrades laser performance.

Secondly, the III-V materials, in their wurtzite or hexagonal crystalline form, exhibit large spontaneous polarization charges at heterointerfaces and strong piezoelectric effects at lattice mismatched heterointerfaces, especially when grown along the [0001] crystal orientation or c-axis as is usually the case. The direction of the resulting polarization field is such that it adversely affects the optical recombination rate in a conventional p-up device.

All prior nitride-based pn junctions, which have been created for purposes of efficient light emission, have been grown by OMVPE, and include InGaN quantum wells which concentrate the electrons and holes together to achieve a large pn product and efficient radiative recombination. As a consequence of OMVPE growth kinetics, the growth along the wurtzite c-axis occurs with the so-called gallium-face exposed at the surface. This crystal orientation fixes the orientation of the polarization fields at any InGaN/GaN quantum wells in the structure. In all devices reported to date, these fields have been opposed to the built-in field of the pn junction, whose direction is fixed by the n-layer always being grown first.

Broadly, it is the object of the present invention to provide improved LEDs and semiconductor lasers based on group III-V semiconductors.

It is a further object of the present invention to provide light emitting devices with increased light output efficiency.

These and other objects of the present invention will become apparent to those skilled in the art from the following detailed description of the invention and the accompanying drawings.

SUMMARY OF THE INVENTION

The present invention is an optical semiconductor device and method of making the same in which the device has an active layer for generating light via the recombination of holes and electrons therein. The active layer includes a plurality of semiconductor layers including an n-p junction between an n-type layer and a p-type layer. The active layer has a polarization field therein having a field direction that depends on the orientation of the active layer when the active layer is grown. In the present invention, the polarization field in the active layer has an orientation such that the polarization field is directed from the n-layer to the p-layer. Including a reverse bias tunnel diode in the optical device can provide the desired field orientation. In other embodiments, the field orientation is achieved by growing the active layer on a substrate that induces growth in a manner that provides the desired field direction. In one embodiment, the device is grown on a substrate having a crystalline axis at an angle to the Ga- and N-faces of GaN-based layer.

DETAILED DESCRIPTION OF THE INVENTION

Figure 1:
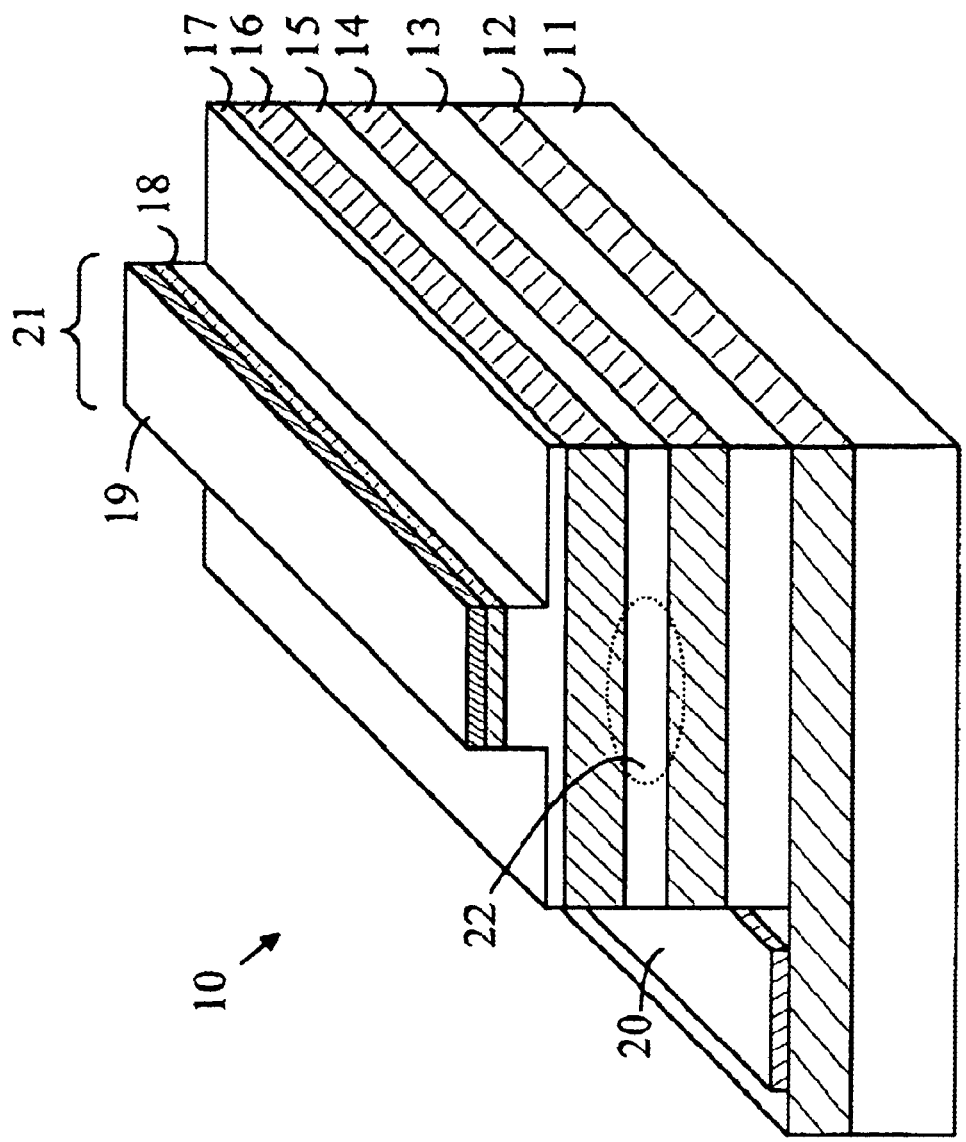
FIG. 1 is a perspective view of an edge-emitting semiconductor laser 10.

The manner in which the present invention provides its advantages may be more easily understood with reference to FIG. 1, which is a perspective view of an edge-emitting semiconductor laser 10. Laser 10 is an example of a specific laser geometry that facilitates low threshold and single lateral mode operation. Laser 10 is constructed on a substrate 11 by growing a number of epitaxial layers on substrate 11. For GaN lasers, the n-type layers are typically constructed first. The first layer is the n-contact layer 12 followed by an n-cladding layer 13. The active layer consisting of a guide layer 14, the light generation layer 15, and a second guide layer 16 are then deposited. A p-cladding layer 17 and a p-contact layer 18 are then deposited on the p-guiding layer 16. A metallic electrode layer 19 is deposited on the p-contact layer to provide one of the electrical connections. The layered stack is then etched to form the ridge structure shown at 21 and to expose the n-contact layer on which metallic electrode 20 is deposited. The light is confined to region 22 by the cladding layers and ridge structure.

Prior-art nitride-based pn junctions that have been created for purposes of efficient light emission, have been grown by OMVPE, and include InGaN quantum wells that concentrate the electrons and holes together to achieve a large p-n product and efficient radiative recombination. As a consequence of OMPVE growth kinetics, the growth along the wurtzite c-axis occurs with the so-called gallium-face exposed at the surface. This crystal orientation fixes the orientation of the polarization fields at any InGaN/GaN quantum wells in the structure. In all devices reported to date, these fields have been opposed to the built-in field of the pn junction, whose direction is fixed by the n-layer always being grown first.

The present invention is based on the observation that this relative orientation between the pn junction and the intense heterostructure polarization field in the InGaN wells is deleterious, and that the resultant reduction in efficiency is large. This field depletes electrons from the n-side of the InGaN wells, depletes holes from the p-side of the InGaN wells, and reduces the pn product in the wells, which dramatically reduces the desired radiative recombination.

If the orientation of this heterostructure polarization field were reversed, the pn product in the wells is increased, with a resultant increase in device efficiency. In addition, the penetration of both carriers beyond the well is drastically reduced. This increased carrier confinement also improves the device efficiency.

There are many ways of realizing the performance advantage that results from reversing the direction of carrier transport relative to the polarization field. First, the devices can be constructed with a p-down light-emitting junction. In a conventional GaN pn junction light-emitting device, the n-layer is always grown first, and the n-type GaN provides current spreading under the device. The lateral conductivity of p-type GaN is generally too low for this purpose. In addition, the commonly used p-type dopant (Mg) will spread into the upper regions of the structure during subsequent processing steps if it is introduced in the lower regions making its profile difficult to control. Further, the p-dopant causes surface roughening and other degradation that reduces the quality of material in layers located above the p-doped region. For all of these reasons, workers in the field have always avoided a p-down structure.

In this embodiment of the present invention, these problems are overcome by growing a heavily-doped p++/n++ junction on an n-type current spreading layer. This method has the additional advantage of providing n-type layers for current spreading on both sides of the junction, and hence, avoids the current spreading problems of prior art devices.

Figure 2:
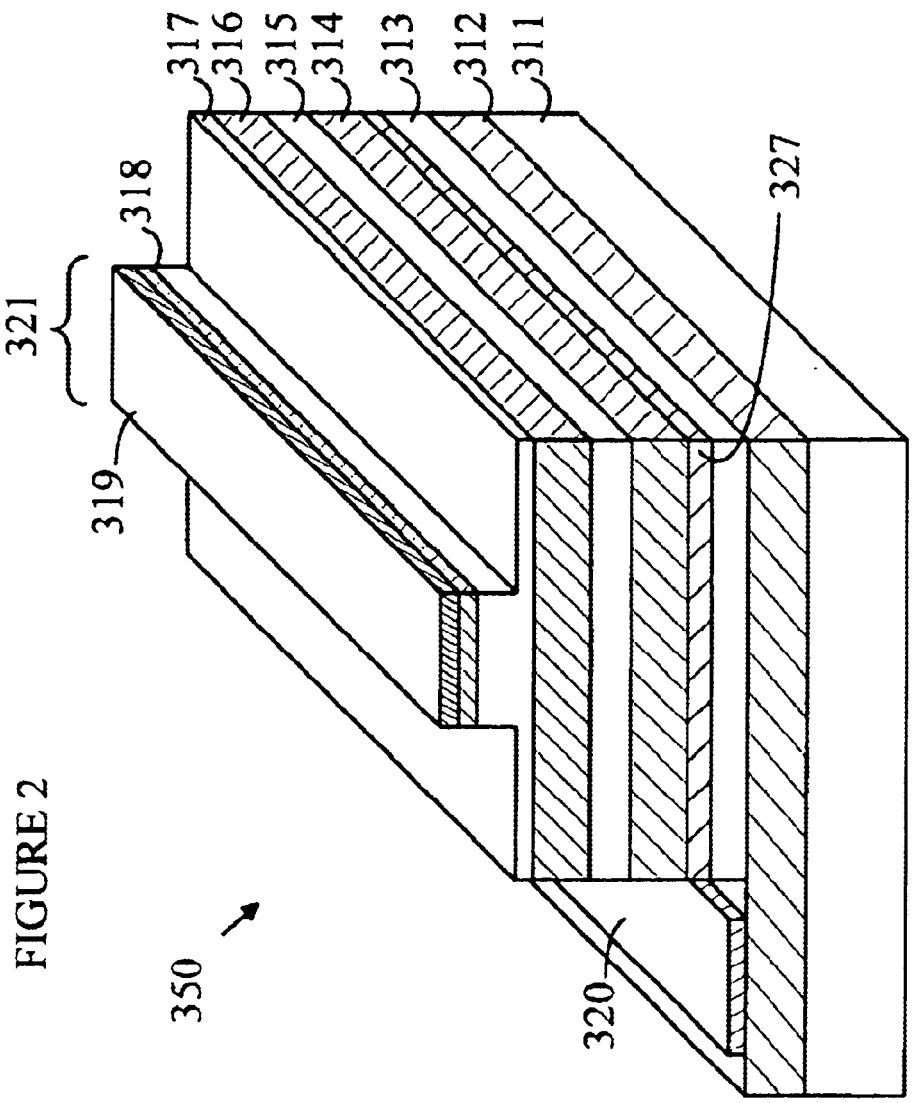
FIG. 2 is a prospective view of a laser 350 according to one embodiment of the present invention.

Refer now to FIG. 2, which is a prospective view of a first embodiment of a laser 350 according to the present invention. Laser 350 utilizes a reverse bias tunnel diode to enable an upside-down arrangement in which the polarization field points in the proper direction to provide increased current confinement. Laser 350 is constructed by depositing an n-contact layer 312 on a sapphire substrate 311. An n-cladding layer 313 is then deposited on n-contact layer 312 and a p-cladding layer 327 is deposited on n-cladding layer 313. The reverse-biased tunnel diode junction is located at the interface of layers 327 and 313 in this embodiment of the present invention. The construction of such reversed-bias tunneling diodes is discussed in detail in U.S. patent application Ser. No. 09/586,406, which is hereby incorporated by reference, and hence, will not be discussed in detail here.

The active region consisting of p-guide layer 314, active layer 315, and n-guide layer 316 is then deposited. A second n-cladding layer 317 and a second n-contact layer 318 are then deposited. The layered stack is then etched to provide ridge region 321 on which an n-electrode 319 is deposited. The second electrical contact 320 is deposited on the first n-contact layer after the stack is etched back to expose layer 312. Electrode 320 is also an n-electrode. Since the resistivity of the n-contact layer 312 is much lower than that of the p-contact layer used in a conventional laser, the current spreading problems associated with a conventional upside-down laser are eliminated. This also applies to LEDs, which are similar in layer structure but without the AlGaN cladding layers. In the case of LEDs, the better carrier confinement obtained with the polarization field reversed relative to the direction of carrier flow, results in less carrier overflow, and hence, increased quantum efficiency at higher current density. This results in a considerable cost advantage by increasing the amount of light flux emitted per unit chip area.

While the discussion of laser 350 utilized a specific location for the reverse bias tunnel diode, it will be obvious to those skilled in the art from the preceding discussion that other locations can be utilized without deviating from the teachings of the present invention. For example, the reverse bias tunnel diode can be placed anywhere between the active region and the n-contact.

The second method for reversing the direction of the polarization field utilizes a GaN starting layer that has a reversed c-axis, i.e., with the nitrogen-face exposed. In the following discussion, the term "reversed c-axis substrate" refers to a substrate with the nitrogen-face exposed. If bulk GaN substrate is available, the nitrogen-face of the bulk GaN 0001 substrate may be utilized. In the absence of such substrates, a GaN layer is grown on a sapphire substrate with the conventional c-axis orientation. The layer is then removed from the original substrate, turned over to provide a starting layer having the nitrogen-face exposed and affixed to an appropriate substrate or carrier to provide support during the subsequent processing. The laser or LED is then constructed in the conventional manner on this reversed c-axis n-doped layer to provide a structure that is similar to that shown in FIG. 1, except for the crystal-orientation of the material in the GaN layer 12.

This embodiment of the present invention is based on the observation that the GaN at the GaN/sapphire interface can be decomposed by exposing the GaN at the interface to UV light in the range of power densities of 5–20 megawatts/cm$^2$ at a wavelength of 248 nm. The GaN is opaque to UV at this wavelength. Sapphire, on the other hand, is transparent to UV light with a wavelength of 248 nm. Hence, UV light directed at the GaN/sapphire interface through the sapphire substrate heats the layer of material at the interface. The GaN is heated to a temperature at which it decomposes the GaN into Ga and N. This procedure has been used to separate GaN thin films from sapphire (W. Wong, T. Sands; 10$^{th}$ Conference on Semiconductor and Insulating Materials, June 1998, Berkeley, Calif., paper Th2.2). This technique, of course, assumes that the GaN layer is sufficiently thick to be self-supporting.

In a third embodiment of the present invention, the reversed c-axis starting layer discussed above is obtained by growing a "seed layer" with the reversed c-axis by a technique such as MBE. The "conventional" device structure is then grown on this "polarization-reversed substrate". Again, the doping can now be p on top and n on the bottom and still provide the correct orientation of the polarization field. Methods for growing such inverted structures are known to the art. The reader is directed to M. J. Murphy, et al, "Molecular beam epitaxial growth of normal and inverted two-dimensional electron gases in AlGan/GaN based heterostructures", *J. Vac. Sci. Technol. B.*, 17(3), May-June 1999, which is hereby incorporated by reference.

Figure 3:
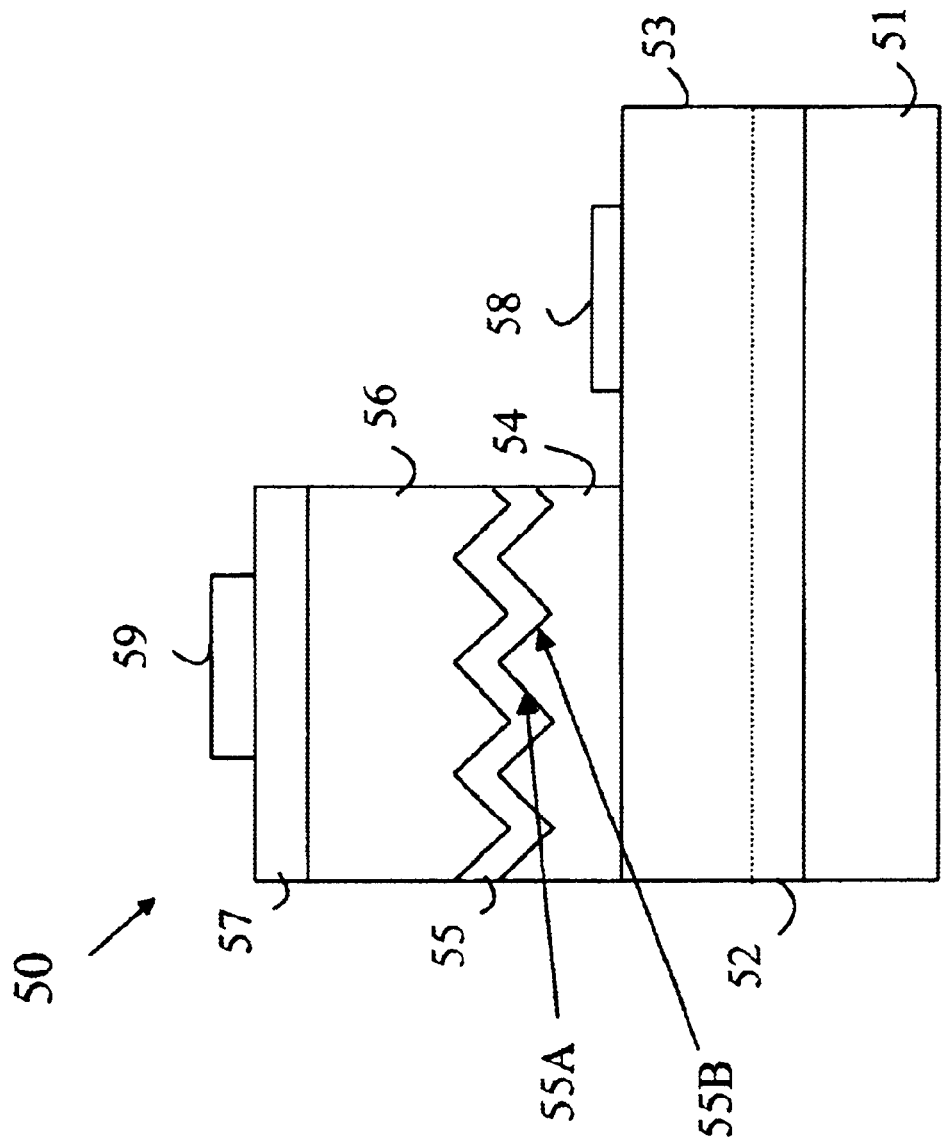
FIG. 3 is a cross-sectional view of the optical semiconductor device 50 according to another embodiment of the present invention.

In a fourth embodiment of the present invention, a different crystal orientation in which the polarization field is in the proper orientation is provided by selectively etching or growing a surface on a conventional device to provide a growth surface on a crystal face having the proper orientation. Refer now to FIG. 3, which is a cross-sectional view of the optical semiconductor device 50 according to another embodiment of the present invention in which only the layers related solely to light emission and absorption have the desired facet orientation. Device 50 is constructed by growing an n-type GaN contact layer 53 and an n-type AlGaN cladding layer 54 on the {0001} plane orientation on the substrate 51 such as SiC or GaN based on conventional technology. Next, by selective growing or selective etching, a new plane is exposed or formed. The GaInN/GaN or GaInN/GaInN strained multiple quantum well layer 55 is then formed by repeating the crystal growth on this new plane.

Next, the remaining p-type AlGaN cladding layer 56 and the p-type GaN contact layer 57 are successively deposited and formed. The p-type AlGaN cladding layer 56 and the p-type GaN contact layer 57 change the crystal structure back to that corresponding to the {0001} plane from the facet orientation of the well layer 55 and become layers with specific thicknesses. The n-electrode 58 and the p-electrode 59 are formed as the electrodes on the n-type GaN contact layer 53 and the p-type GaN contact layer 57, respectively. The growing surfaces 55A, 55B on both sides of the GaInN strained multiple quantum well layer 55 are the desired plane, i.e., the plane for which the polarization has the desired orientation. The p-type AlGaN cladding layer 56 and the p-type GaN contact layer 57 become flat growing surfaces. To simplify the next process, it is advisable that they be several microns thick. In the preferred embodiment of the present invention, an AlN buffer layer 52 is grown on the substrate 51.

While the present invention has been described in terms of GaN devices, it will be obvious to those skilled in the art from the preceding discussion that the invention is applicable to any material system in which polarization fields (or polarization charges) appear when heterostructures are fabricated. For example, the present invention is applicable to any heterostructure device, which incorporates a pn junction, or a metal-semiconductor junction, with a built-in field. Examples of such devices include LEDs, resonant cavity LEDs, edge-emitting lasers, and VCSELs.

Various modifications to the present invention will become apparent to those skilled in the art from the foregoing description and accompanying drawings. Accordingly, the present invention is to be limited solely by the scope of the following claims.

What is claimed is:

1. An optical semiconductor device comprising an edge-emitting laser having an active layer comprising, an n-p junction between an n-type layer and a p-type layer, said active layer emitting light when holes and electrons recombine therein, said active layer having a polarization field therein having a field direction that depends on the orientation of said active layer when said active layer is grown, wherein said active layer has an orientation such that said polarization field is directed from said n-layer to said p-layer, said semiconductor device further comprising a substrate, an n-type base layer on said substrate, and a reverse biased tunnel diode between said active layer and said n-type base layer.

2. The optical semiconductor device of claim 1 wherein one of said layers comprises GaN.

3. An optical semiconductor device having an active layer comprising an n-p junction between an n-type layer and a p-type layer, said active layer emitting light when holes and electrons recombine therein, said active layer having a polarization field therein having a field direction that depends on the orientation of said active layer when said active layer is grown, wherein said active layer has an orientation such that said polarization field is directed from said n-layer to said p-layer, wherein said semiconductor layers are grown on an n-type GaN base layer having a reversed c-axis.

4. The optical semiconductor device of claim 3 wherein said base layer comprises a GaN layer grown by molecular beam epitaxial deposition.

5. An optical semiconductor device having an active layer comprising, an n-p junction between an n-type layer and a p-type layer, said active layer emitting light when holes and electrons recombine therein, said active layer having a polarization field therein having a field direction that depends on the orientation of said active layer when said active layer is grown, wherein said active layer has an orientation such that said polarization field is directed from said n-layer to said p-layer, wherein said semiconductor device is grown on a substrate having a planar surface and wherein said n-p junction is titled at an angle with respect to said substrate.

6. In a method for fabricating a semiconductor light emitting device comprising a plurality of semiconductor layers including an active layer between an n-type layer and a p-type layer, said active layer generating light by the recombination of holes and electrons, said active layer having a polarization field therein with a field direction that depends on the orientation of said active layer when said active layer is grown, the improvement comprising growing one of said plurality of semiconductor layers on a base layer such that said polarization field is directed from said n-layer to said p-layer, wherein said base layer is generated by growing a GaN seed layer having a top and bottom surface, said bottom surface being in contact with a substrate that causes said GaN layer to have a crystal orientation in the wurtzite c-axis direction; removing said seed layer from said substrate; and growing said base layer on said bottom surface of said seed layer.

7. The method of claim 6 wherein said base layer is grown by molecular beam epitaxial growth.

8. The method of claim 6 wherein said substrate comprises sapphire and wherein said seed layer is removed by heating an interface between said seed layer and said substrate.

9. The method of claim 8 wherein said interface is heated by exposing said substrate to light of a wavelength that is absorbed by GaN but not by sapphire.

10. In a method for fabricating a semiconductor light emitting device comprising a plurality of semiconductor layers including an active layer between an n-type layer and a p-type layer, said active layer generating light by the recombination of holes and electrons, said active layer having a polarization field therein with a field direction that depends on the orientation of said active layer when said active layer is grown, the improvement comprising growing one of said plurality of semiconductor layers on a base layer such that said polarization field is directed from said n-layer to said p-layer, wherein said semiconductor light emitting device comprises a substrate having a planar surface on which said layers are grown and wherein said active layer is grown on a surface that is tilted at an angle with respect to said substrate.

\* \* \* \* \*